United States Patent
Yu et al.

(10) Patent No.: US 10,269,718 B2
(45) Date of Patent: Apr. 23, 2019

(54) RECTANGULAR SEMICONDUCTOR PACKAGE AND A METHOD OF MANUFACTURING THE SAME

(71) Applicant: WALTON ADVANCED ENGINEERING INC., Kaohsiung (TW)

(72) Inventors: Hong Chi Yu, Kaohsiung (TW); Chun Jung Lin, Kaohsiung (TW)

(73) Assignee: WALTON ADVANCED ENGINEERING INC., Kaohsiung (TW)

(*) Notice: Subject to any disclaimer, the term of this patent is extended or adjusted under 35 U.S.C. 154(b) by 0 days.

(21) Appl. No.: 15/652,373

(22) Filed: Jul. 18, 2017

(65) Prior Publication Data

US 2018/0350746 A1  Dec. 6, 2018

(30) Foreign Application Priority Data

Jun. 6, 2017 (TW) .............................. 106118729 A

(51) Int. Cl.
*H01L 25/065* (2006.01)
*H01L 23/538* (2006.01)
(Continued)

(52) U.S. Cl.
CPC ...... *H01L 23/5386* (2013.01); *H01L 21/4853* (2013.01); *H01L 21/565* (2013.01); *H01L 21/568* (2013.01); *H01L 21/6835* (2013.01); *H01L 23/3114* (2013.01); *H01L 25/0655* (2013.01); *H01L 25/0657* (2013.01); *H01L 25/105* (2013.01); *H01L 25/50* (2013.01);
(Continued)

(58) Field of Classification Search
CPC . H01L 23/5386; H01L 25/0657; H01L 25/50; H01L 23/3128; H01L 25/105; H01L 25/0655; H01L 21/4853; H01L 21/6835; H01L 21/568; H01L 21/565; H01L 24/48; H01L 23/3114; H01L 2225/107; H01L 2225/06586; H01L 2225/06562; H01L 2225/06548; H01L 2225/0651; H01L 2221/68345; H01L 2224/48106; H01L 2221/68359; H01L 2224/48221
See application file for complete search history.

(56) References Cited

U.S. PATENT DOCUMENTS

| | | | |
|---|---|---|---|
| 9,543,242 B1* | 1/2017 | Kelly | H01L 23/49816 |
| 2010/0140759 A1* | 6/2010 | Pagaila | H01L 21/565 |
| | | | 257/660 |
| 2012/0119388 A1* | 5/2012 | Cho | H01L 21/56 |
| | | | 257/778 |

* cited by examiner

*Primary Examiner* — David Vu
(74) *Attorney, Agent, or Firm* — Bacon & Thomas, PLLC

(57) ABSTRACT

A rectangular semiconductor package and a method manufacturing the same described in the present disclosure features no carrier installed on a die cut from a wafer. In an embodiment, a first die on a top surface of a conductive routing layer is electrically connected to the conductive routing layer through a plurality of first metal wires, a plurality of conductive balls is installed on a bottom surface of the conductive routing layer, and a molding compound is used to encase the first die on the conductive routing layer. In another embodiment, a second die is added in the above rectangular semiconductor package and encased in the molding compound, as is the first die. Alternatively, the molding compound is processed such that the second die encapsulated in a package is stacked on the molding compound and electrically connected to the conductive routing layer.

3 Claims, 15 Drawing Sheets

(51) Int. Cl.
  *H01L 23/31*    (2006.01)
  *H01L 21/56*    (2006.01)
  *H01L 21/683*   (2006.01)
  *H01L 25/10*    (2006.01)
  *H01L 25/00*    (2006.01)
  *H01L 21/48*    (2006.01)
  H01L 23/00      (2006.01)

(52) U.S. Cl.
  CPC .......... *H01L 23/3128* (2013.01); *H01L 24/48* (2013.01); *H01L 2221/68304* (2013.01); *H01L 2221/68345* (2013.01); *H01L 2221/68359* (2013.01); *H01L 2224/48106* (2013.01); *H01L 2224/48221* (2013.01); *H01L 2224/48245* (2013.01); *H01L 2224/73265* (2013.01); *H01L 2224/83005* (2013.01); *H01L 2224/85005* (2013.01); *H01L 2225/0651* (2013.01); *H01L 2225/06548* (2013.01); *H01L 2225/06562* (2013.01); *H01L 2225/06586* (2013.01); *H01L 2225/107* (2013.01)

RECTANGULAR SEMICONDUCTOR PACKAGE AND A METHOD OF MANUFACTURING THE SAME

BACKGROUND OF THE INVENTION

1) Field of the Invention

The present disclosure relates to a semiconductor packaging device and a method manufacturing the same, particularly the application of a fan-out package in which no carrier is required for a die cut from a wafer according to a conductive routing layer as a substrate created by the redistribution layer technique.

2) Description of the Prior Art

In most modern semiconductor packaging techniques, the IC chip(s) should be encased in encapsulation material first and match created fan-out areas based on circuits or a built-up redistribution layer on a substrate for additions of more I/O points on extra space such as fan-out area.

As the functions of electronic products get complicated, more and more I/O connections should be applicable to IC chips in the upstream industry as well as limited layout space during corresponding semiconductor packaging and become challenges for the prevalent application like Package on Package (POP) because of more I/O points designed on limited space.

Contributing to a compact low-cost package, the technology of Fan-out Wafer Level Packaging (FoWLP), which had replaced traditional PCBs since 2016 when the components such as A10 processor and antenna switch module were mounted in iPhone7, are adopted by more and more chipmakers.

There have been multiple patents for fan-out packaging disclosed as follows:

U.S. 62/082,557 disclosed a fan-out wafer level package and a method of manufacturing the same. In one embodiment, a package comprises a first routing layer, a first die mounted on a top surface of the first routing layer, and a first molding compound in which the first die on the first routing layer is encased. A plurality of first conductive pillars is extended from a bottom surface of the first routing layer. A second die is mounted on a top surface of a second routing layer and the plurality of first conductive pillars is designed on the top surface of the second routing layer. A second molding compound is used to encase the first molding compound, the first routing layer, the plurality of first conductive pillars, and the second die on the second routing layer. In one embodiment, a plurality of conductive bumps (for example, solder balls) is extended on a bottom surface of the second routing layer.

TW I 1351088 disclosed a wafer level chip scale package, which comprises a die with a plurality of bonding pads on the die's active surface, an encapsulation body sealing the die's five surfaces, a patterned polymer layer, and a plurality of patterned metal lines covering the patterned polymer layer partially and electrically connected to a plurality of bonding pads on the die's active surface. A wafer level chip scale package features: the patterned polymer layer constitutes a fan-out sidestep structure on the die's active surface and a partial area outside the active surface; the fan-out sidestep structure is structurally elevated at a terminal point and forms holes opposite to a plurality of bonding pads on the die's active surface for exposing all bonding pads; the plurality of patterned metal lines developed on the patterned polymer layer contribute to electrical connections between a plurality bonding pads on a die's active surface and a plurality of patterned metal lines on the polymer layer of the sidestep structure; a shielding layer covers a plurality of patterned metal lines and the patterned polymer layer partially and allows a surface in which a plurality of patterned metal lines on the elevated patterned polymer layer in the sidestep structure is positioned to be exposed.

TW 104139373 disclosed fan-out POP (Package on Package) SIP (System in Package) with dummy dies and a method of manufacturing the same. In an exemplary embodiment, a package comprises a first fan-out layer, a fan-out redistribution layer (RDL) on the first fan-out layer, and a second fan-out layer on the fan-out RDL. The first fan-out layer comprises one or a plurality of first device dies and first molded plastic material extended along lateral sides of the one or plurality of first device dies. The second fan-out layer comprises one or a plurality of device dies connected to the fan-out RDL, dummy dies connected to the fan-out RDL, and second molded plastic material extended along lateral sides of the one or plurality of second device dies and the dummy dies. The fan-out RDL is used to electrically connect the one or plurality of first device dies and the one or plurality of second device dies; the dummy dies are void without any active device. As such, a package is free from warpage induced by difference in material.

TW I298193 disclosed a semiconductor packaging device which comprises: a cavity or a slot on a carrier; at least a chip comprising a back surface as well as first bonding pads with active surfaces, fixed in the cavity, and allowing the active surfaces to be exposed; a first insulating barrier designed on the carrier as well as the active surfaces and comprising first conductive clearance holes opened on the first insulating barrier and interconnecting the first bonding pads; a multi-layer structure designed on the first insulating barrier, comprising layout circuits, second conductive clearance holes and at least a second insulating barrier, and allowing ball pads to be exposed. In the multi-layer structure, the layout circuits, the second conductive clearance holes and ball pads are electrically connected to the first conductive clearance holes and the solder balls are fixed on the ball pads. As such, a semiconductor packaging device in which redistribution and fan-out processes of ordinary flip chip packages are integrated simplifies the current flip chip ball grid array process.

U.S. Pat. No. 6,770,959B2 disclosed a semiconductor package without substrate and a method of manufacturing the same wherein the method presents an interim substrate which has a front surface covered with a solder mask at selected locations. The front surface not covered by the solder mask comprises a plurality of lead layers and a plurality of die pad layers. The top side of a die pad layer adheres to a chip. The chip and lead layers are electrically connected by a plurality of bonding wires. The chip, the bonding wires, the solder mask, the lead layers and the die pad layers are covered by molded resin. With a package singularized, the interim substrate is removed in an etching process for development of a semiconductor package without substrate.

However, the fan-out wafer level packaging techniques are available to chipmakers preferably rather than the back-end packaging industry under business pressure and deserve to be promoted for probable effects with dies manufactured on wafers.

SUMMARY OF THE INVENTION

In virtue of above issues, a rectangular semiconductor package and a method manufacturing the same provided in the present disclosure depend on the current fan-out packaging technique for dies cut from wafers and fan-out wafer level packaging.

The present disclosure is to provide a rectangular semiconductor package and a method manufacturing the same for a thinner low-cost package in which no carrier is required.

The present disclosure is to provide a rectangular semiconductor package and a method manufacturing the same for upgrade of a current fan-out wafer level process to a fan-out chip level process.

The present disclosure is to provide a rectangular semiconductor package and a method manufacturing the same for more conductive I/O points on an encapsulated chip based on fan-out packaging.

The present disclosure is to provide a rectangular semiconductor package and a method manufacturing the same by which the capacity of a current MLC (Multi Level Cell) memory encapsulated and thinned during a packaging process is augmented.

The present disclosure is to provide a rectangular semiconductor package and a method manufacturing the same, which depend on the back-end chip level packaging technique for a minor packaging manufacturer's flexible purchasing and process strategies.

To this end, a rectangular semiconductor package and a method manufacturing the same rely on the following major technical measures. The present disclosure relates to a rectangular semiconductor package in which no carrier is required for a die cut from a wafer; the rectangular semiconductor package comprises: a conductive routing layer, a first die mounted on a top surface of the conductive routing layer and electrically connected to the conductive routing layer through a plurality of first metal wire, a plurality of conductive balls on a bottom surface of the conductive routing layer, and a molding compound used to encase the first die on the conductive routing layer.

A rectangular semiconductor package and a method manufacturing the same are further embodied according to the following technical measures.

In the rectangular semiconductor package, the conductive routing layer allows a plurality of conductive bumps to be extended on the top surface.

In the rectangular semiconductor package, a second die can be mounted on or beside the first die.

In the rectangular semiconductor package, a plurality of conductive bumps is exposed on a grooved or planar surface of the molding compound.

In the rectangular semiconductor package, the second die is electrically connected to the conductive routing layer through a plurality of conductive bumps.

In the rectangular semiconductor package, the second die is electrically connected to the conductive routing layer through a plurality of second metal wires.

In the rectangular semiconductor package, the molding compound is used to encase the second die.

In the rectangular semiconductor package, the molding compound does not cover a top surface of the second die.

To this end, a rectangular semiconductor package and a method manufacturing the same further depend on the following major technical measures. The present disclosure relates to a method of manufacturing a rectangular semiconductor package in which no carrier is required for a die cut from a wafer; the method presents steps as follows. Step 1: a conductive routing layer is created on a carrier by the redistribution layer (RDL) technique; step 2: a first die is securely adhered on the conductive routing layer and electrically connected to the conductive routing layer through a plurality of first metal wires; step 3: a molding compound is used to encase the first die; step 4: the carrier is removed; step 5: a plurality of conductive balls and the conductive routing layer are bonded together.

The method of manufacturing a rectangular semiconductor package is further embodied according to the following technical measures.

In the method, a plurality of conductive bumps is created on a carrier by the redistribution layer (RDL) technique in step 1.

In the method, a second die is stacked on the first die after step 1.

In the method, a second die is mounted beside the first die after step 1.

In the method, a plurality of conductive bumps is processed and exposed on the surface of the molding compound after step 3.

In the method, the second die and the conductive routing layer are electrically connected to each other through a plurality of second metal wires before step 3.

In the method, the molding compound is used to encase the second die in step 3.

In the method, an encapsulated component is stacked on the molding compound and electrically connected to a plurality of conductive bumps after step 3.

In contrast to conventional techniques, a rectangular semiconductor package and a method manufacturing the same in the present disclosure have the following effects: (1) a PCB is replaced by a conductive routing layer; (2) a package from which a carrier is removed is thinned and inexpensive; (3) POP (Package on Package) enabled with fan-out packaging outside a wafer maker is flexible.

BRIEF DESCRIPTIONS OF THE DRAWINGS

Figure 6A:
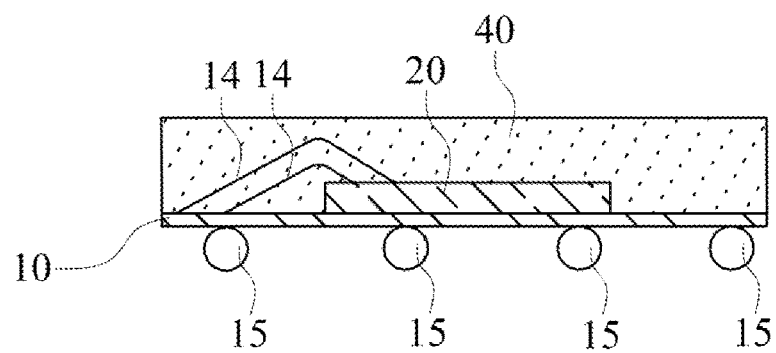
FIG. 6a is a first schematic view for additions of conductive balls in a preferred embodiment.
Figure 6B:
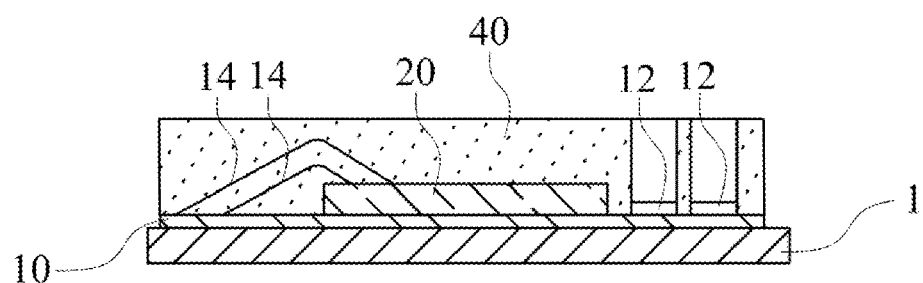
FIG. 6b is a first schematic view for processing of a rectangular semiconductor package in a preferred embodiment.
Figure 6C:
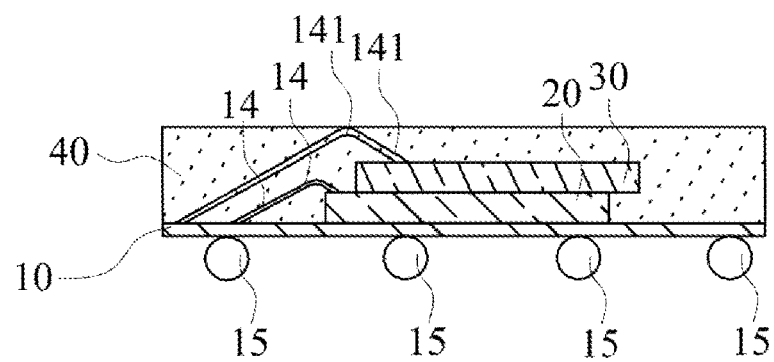
FIG. 6c is a second schematic view for additions of conductive balls in a preferred embodiment.
Figure 6D:
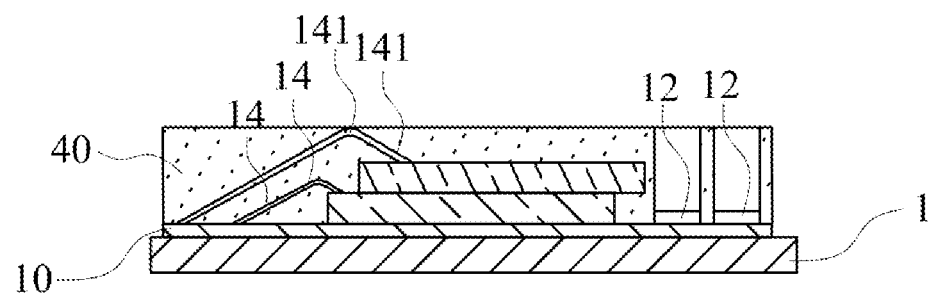
Figure 6E:
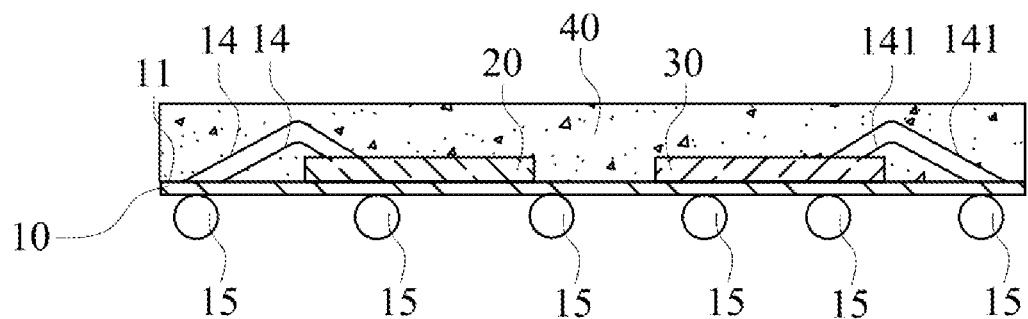
Figure 7A:
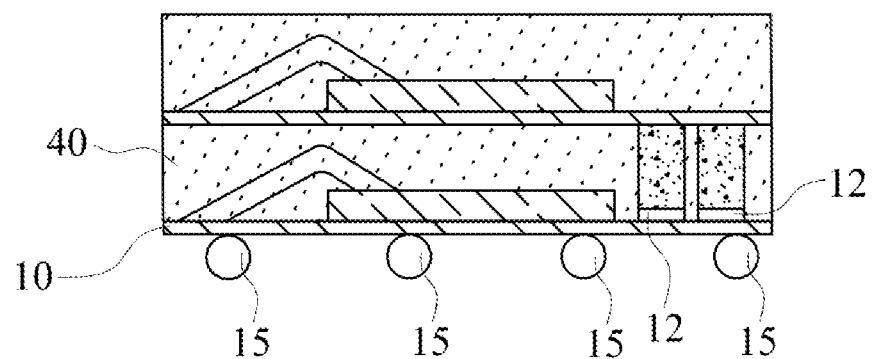
Figure 7B:
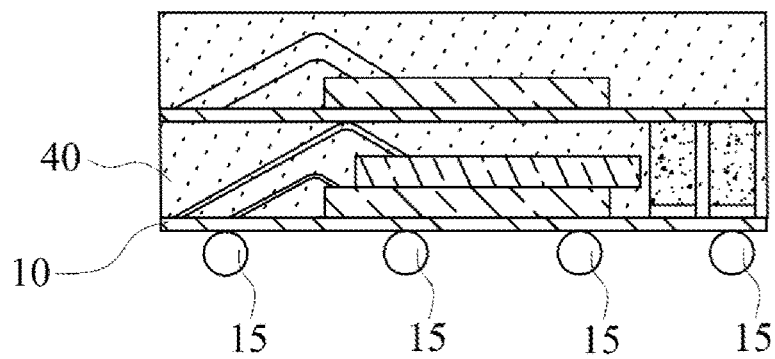
Figure 8A:
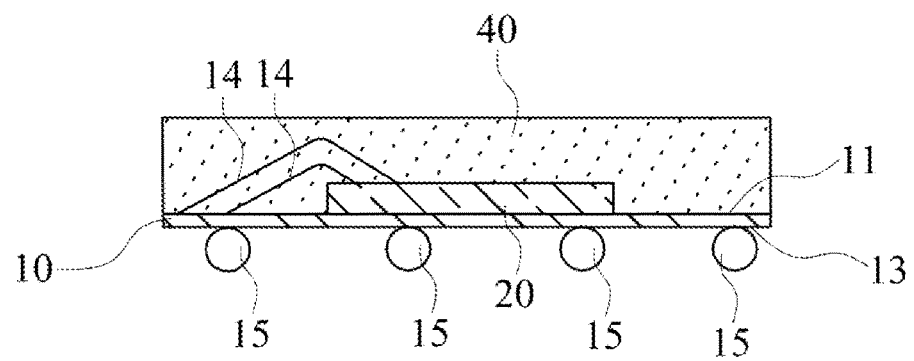
Figure 8B:
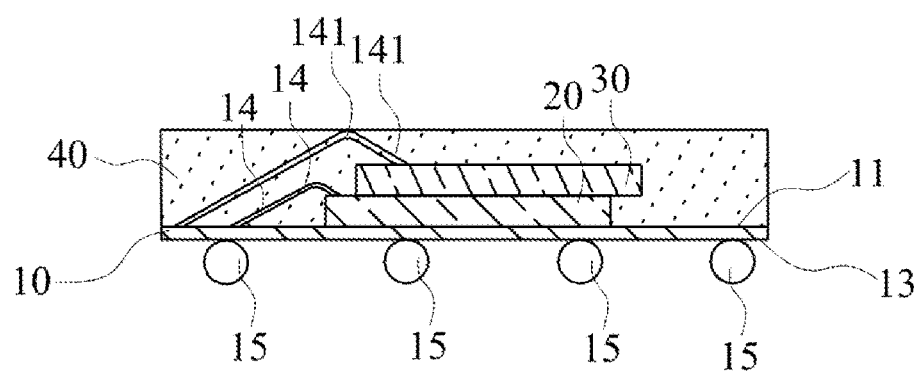
Figure 8C:
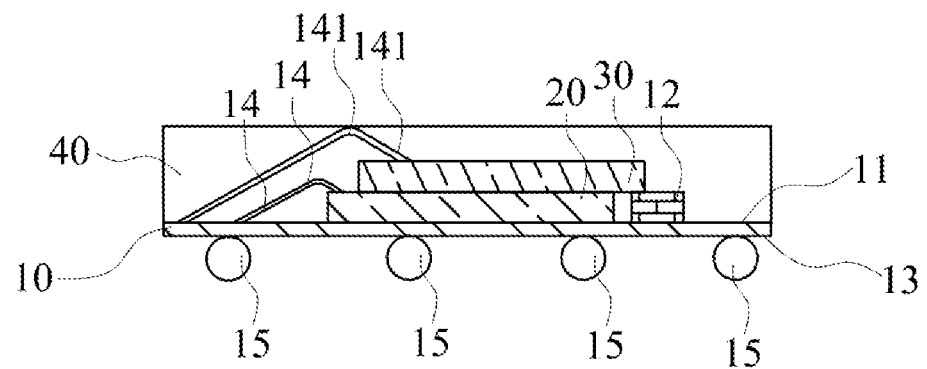
Figure 8D:
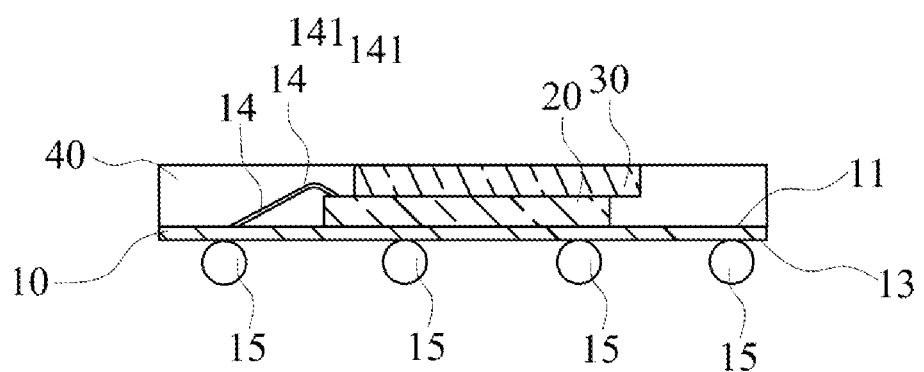
Figure 9:
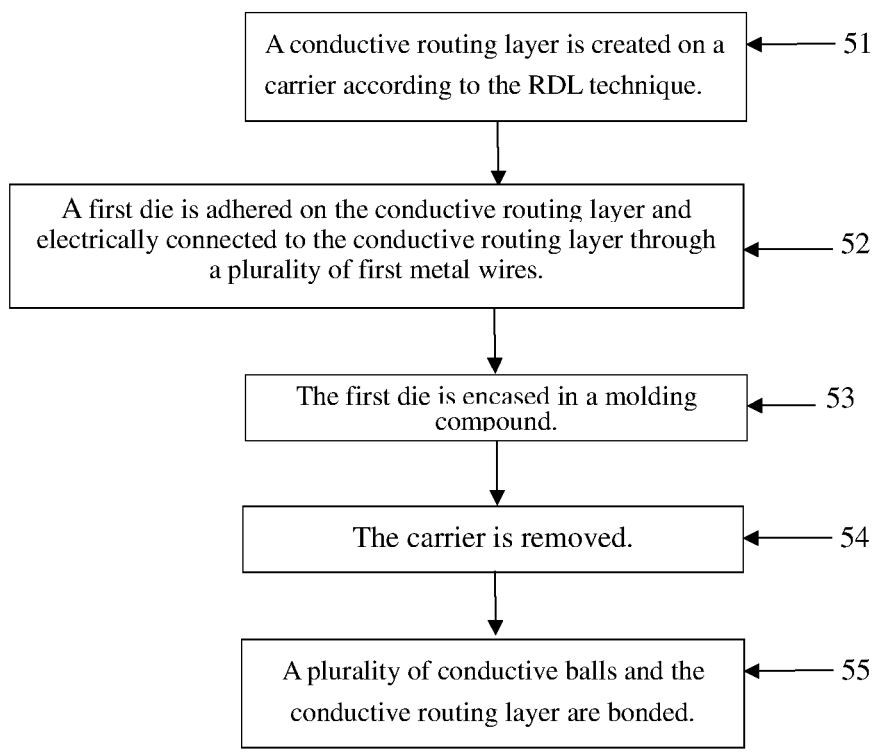
Figure 10A:
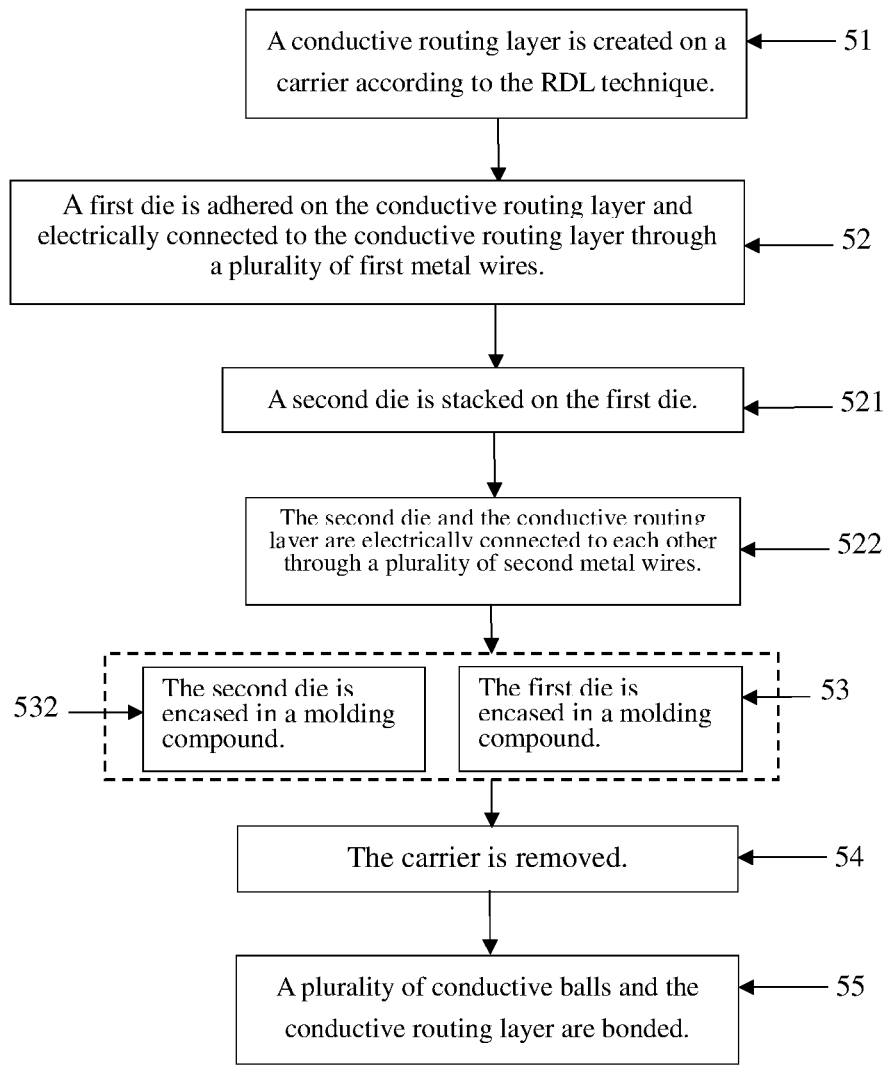
Figure 10B:
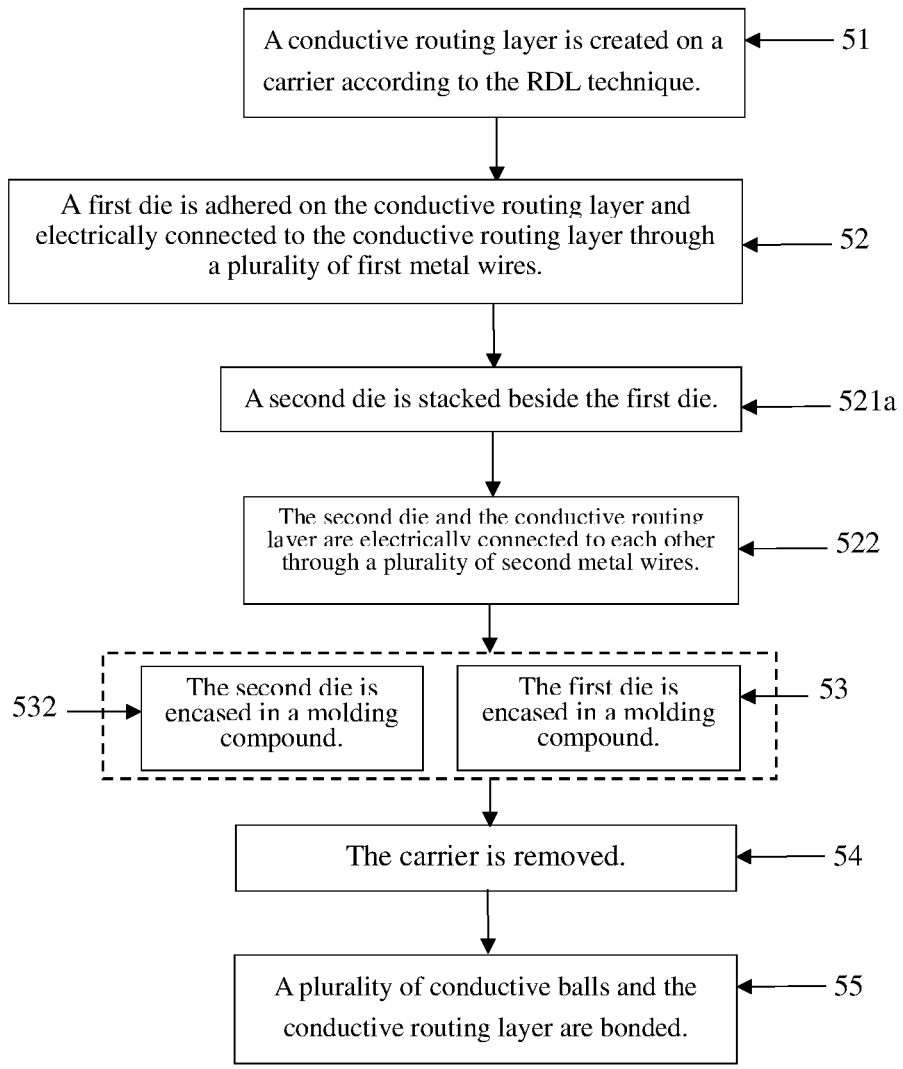
Figure 11:
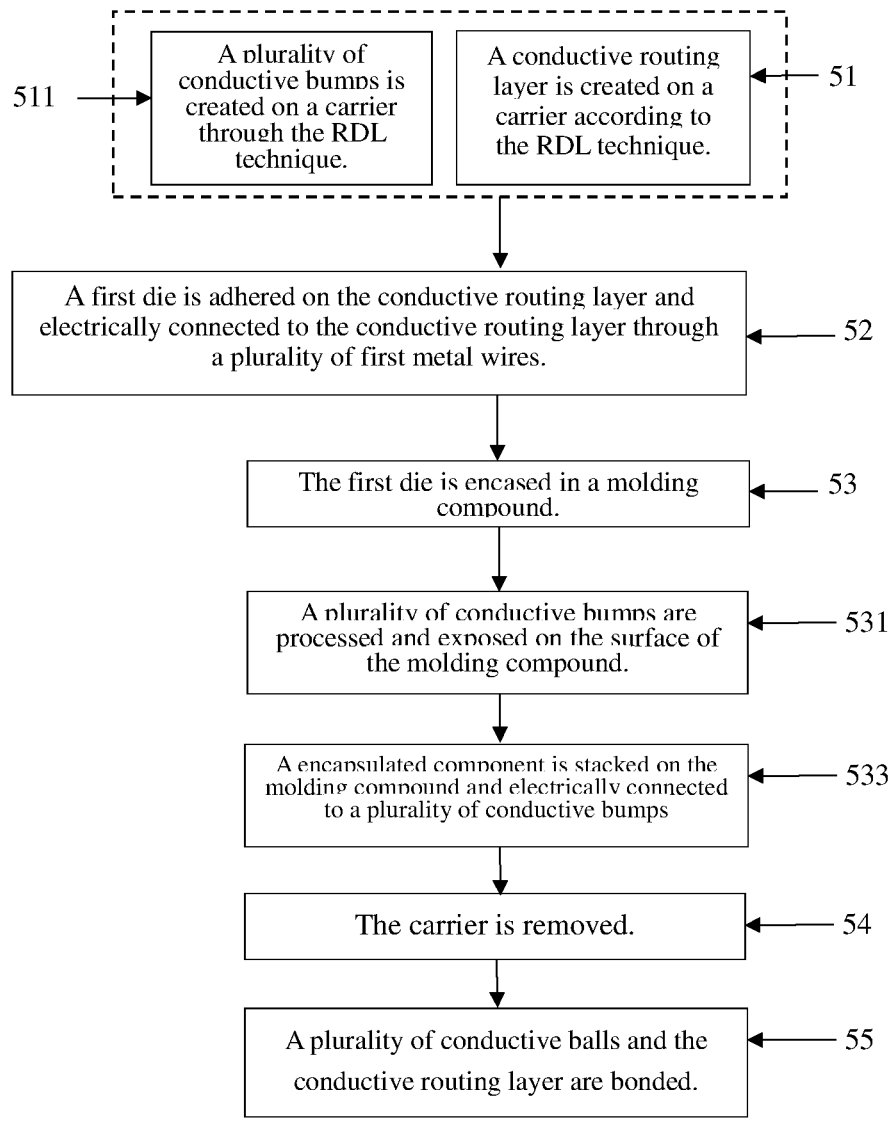
Figure 12:
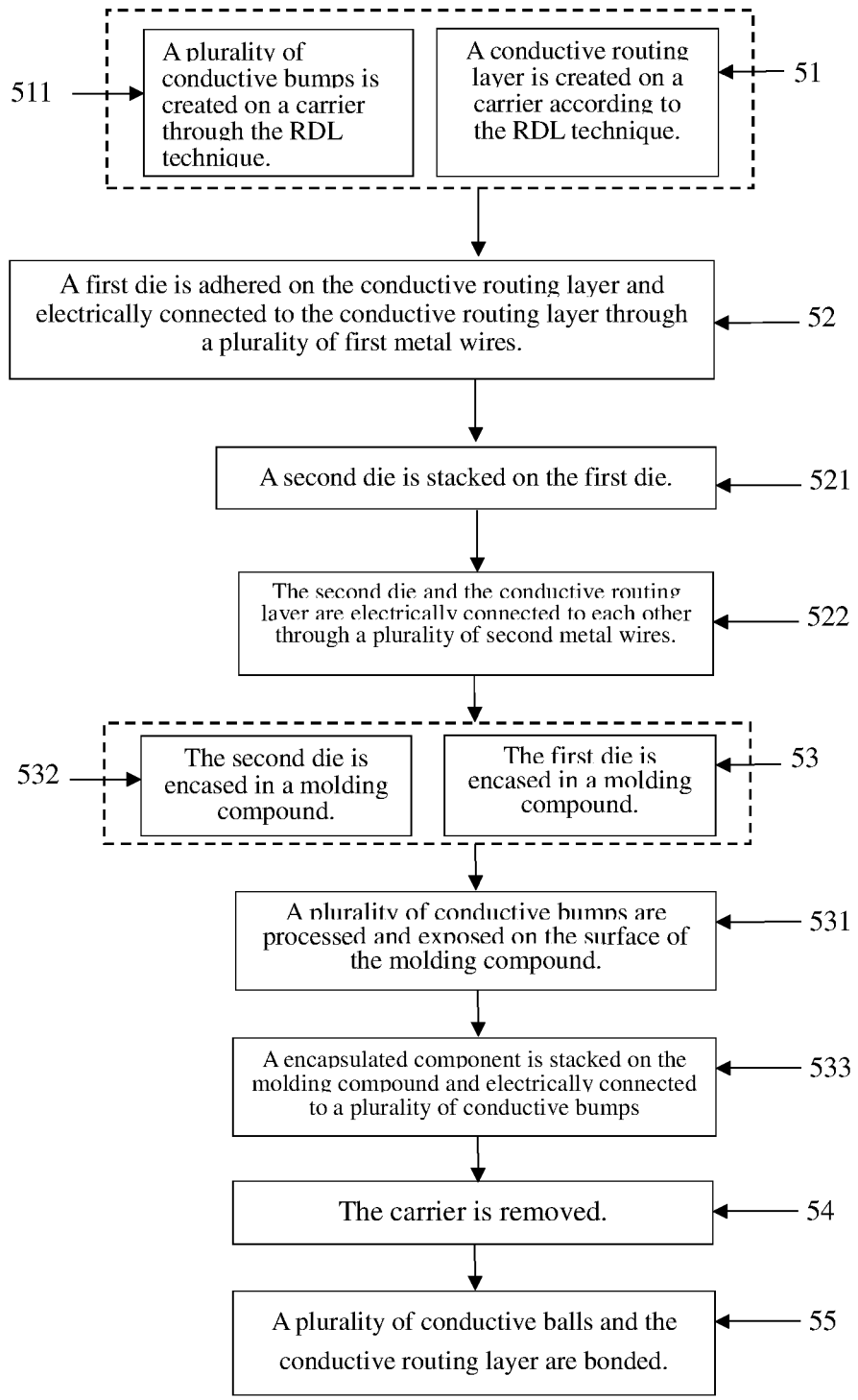

FIG. 6d a second schematic view for processing of a rectangular semiconductor package in a preferred embodiment;

FIG. 6e is a third schematic view for additions of conductive balls in a preferred embodiment;

FIG. 7a is a first schematic view for a stacked package in a preferred embodiment;

FIG. 7b is a second schematic view for a stacked package in a preferred embodiment;

FIG. 8a is a first schematic view for structure of a rectangular semiconductor package in a preferred embodiment;

FIG. 8b is a second schematic view for structure of a rectangular semiconductor package in a preferred embodiment;

FIG. 8c is a third schematic view for structure of a rectangular semiconductor package in a preferred embodiment;

FIG. 8d is a fourth schematic view for structure of a rectangular semiconductor package in a preferred embodiment;

FIG. 9 is a first flow chart for a method of manufacturing a rectangular semiconductor package in a preferred embodiment;

FIG. 10a is a second flow chart for a method of manufacturing a rectangular semiconductor package in a preferred embodiment;

FIG. 10b is a third flow chart for a method of manufacturing a rectangular semiconductor package in a preferred embodiment;

FIG. 11 is a fourth flow chart for a method of manufacturing a rectangular semiconductor package in a preferred embodiment;

FIG. 12 is a fifth flow chart for a method of manufacturing a rectangular semiconductor package in a preferred embodiment.

DETAILED DESCRIPTIONS OF THE PREFERRED EMBODIMENTS

A rectangular semiconductor package and a method of manufacturing the same are further illustrated in preferred embodiments for clear understanding of purposes, characteristics and effects:

FIGS. 1, 2a, 3a, 4a, 5a, 6a, 8a and 9 illustrate a rectangular semiconductor package and a method manufacturing the same in the first embodiment; referring to FIG. 8a, which illustrates a conductive routing layer (10), a first die (20) mounted on a top surface (11) of the conductive routing layer (10) and electrically connected to the conductive routing layer (10) through a plurality of first metal wires (14), a plurality of conductive balls (15) mounted on a bottom surface (13) of the conductive routing layer (10), and a molding compound (40) used to encase the first die (20) on the conductive routing layer (10).

Specifically, the conductive routing layer (10) is a metallic conductive layer by which I/O pads originally designed on an IC chip are modified according to the Redistribution Layer (RDL) technique through a water-level metal routing process or a bumping process for applications of a IC chip in different device modules; the first die (20) is a miniaturized gross die made from semiconductor material and cut from a wafer; the first metal wire (14) is a metal wire with a diameter of 15-50 µm used in a wire bonding process for connection between a chip and a lead frame as well as electrical continuity from a miniaturized single chip to the outside without any excessive area; the conductive balls (15) are solder balls in practice for electrical connection between the conductive routing layer (10) and the outside; the molding compound (40) is semiconductor packaging material and usually polymer resin for encapsulating an electric device and a chip.

Figure 1:
FIG. 1 is a schematic view for a carrier of a rectangular semiconductor package in a preferred embodiment.
Figure 2A:
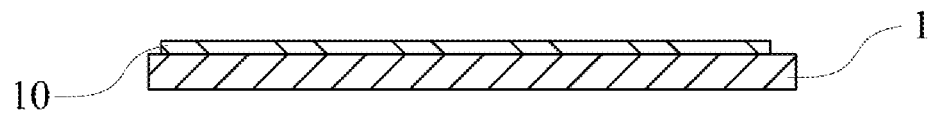
FIG. 2a is a first schematic view for a created conductive routing layer on a rectangular semiconductor package in a preferred embodiment.
Figure 2B:
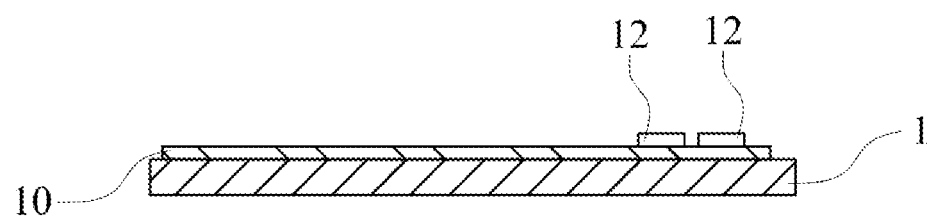
FIG. 2b is a second schematic view for a created conductive routing layer on a rectangular semiconductor package in a preferred embodiment.

Referring to FIG. 9, which illustrates a conductive routing layer (10) is created on a carrier (1) according to the RDL technique in step 1 (51); as shown in FIGS. 1, 2a and 2b, the conductive routing layer (10) (FIG. 2b) is created on the simple carrier (1) (FIG. 1) according to the RDL technique.

Figure 3A:
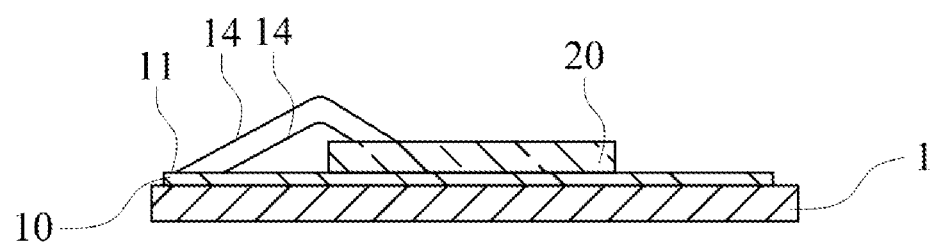
FIG. 3a is a schematic view for connection between a first metal wire and a die in a preferred embodiment.

Referring to FIG. 9 again, which illustrates a first die (20) is adhered on the conductive routing layer (10) and electrically connected to the conductive routing layer (10) through a plurality of first metal wires (14) in step 2 (52); as shown in FIGS. 2a and 3a, the first die (20) is securely adhered on the conductive routing layer (10) and a plurality of first metal wires (14) are bonded between the top surface (11) of the conductive routing layer (10) and the first die (20) in a wire bonding process for electrical connection of each other.

Figure 4A:
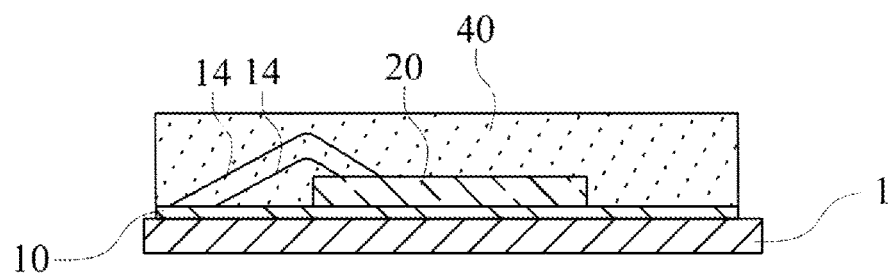
FIG. 4a is a schematic view for a first packaging device in a preferred embodiment.

Referring to FIG. 9 again, which illustrates the first die (20) is encased in a molding compound (40) in step 3 (53); as shown in FIGS. 3a and 4a, polymer resin in a mold is infused on the conductive routing layer (10) for encapsulating the first metal wires (14) and the first die (20).

Figure 5A:
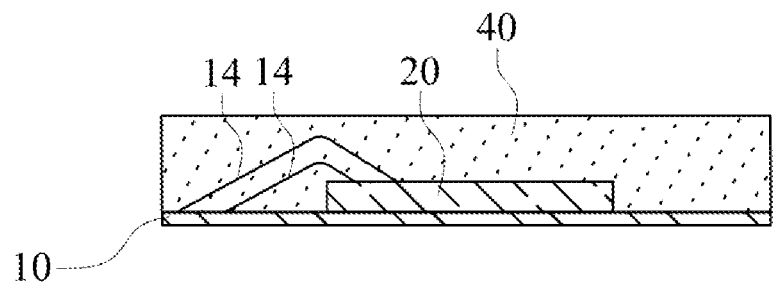
FIG. 5a is a first schematic view for removal of a carrier in a preferred embodiment.
Figure 5B:
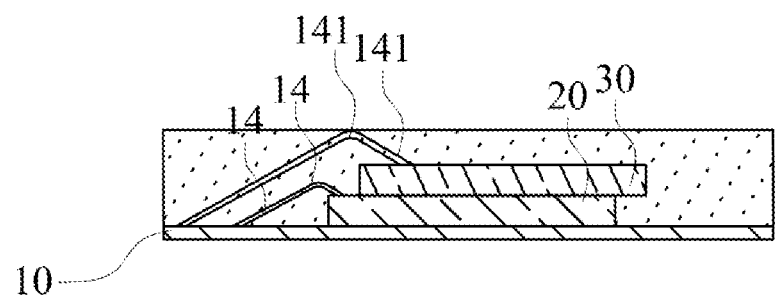
FIG. 5b is a second schematic view for removal of a carrier in a preferred embodiment.
Figure 5C:
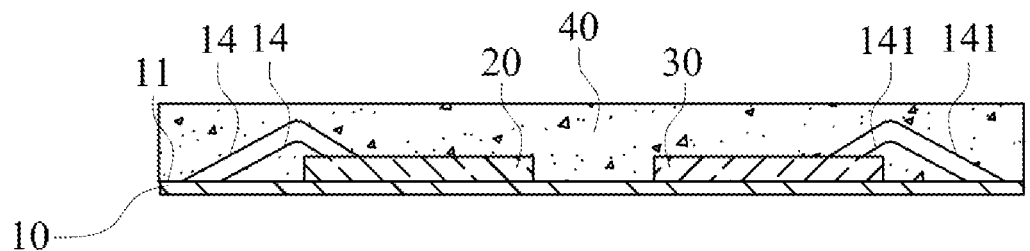
FIG. 5c is a third schematic view for removal of a carrier in a preferred embodiment.

Referring to FIG. 9 again, which illustrates the carrier (1) is removed in step 4 (54); as shown in FIGS. 4a and 5a, the bottom of the conductive routing layer (10) is exposed after the carrier (1) is removed with a tool.

Referring to FIG. 9 again, which illustrates a plurality of conductive balls (15) and the conductive routing layer (10) are bonded in step 5 (55); as shown in FIGS. 5a and 6a, the conductive balls (15) are adhered on the bottom of the conductive routing layer (10) and electrically connected to the first die (20) in a following process.

Referring to FIGS. 1, 2a, 3c, 4c, 5b, 6c, 8b and 10a, which illustrate a rectangular semiconductor package and a method manufacturing the same in the second embodiment; compared with components in the first embodiment, second metal wires (141) and a second die (30) are added in the second embodiment; as shown in FIG. 8b, a second die (30) is mounted over the first die (20) and electrically connected to the conductive routing layer (10) through a plurality of second metal wires (141).

Specifically, the second die (30) is a miniaturized gross die made from semiconductor material and cut from a wafer; the second metal wire (141) is a metal wire with a diameter of 15-50 µm used in a wire bonding process for connection between a chip and a lead frame as well as electrical continuity from a miniaturized single chip to the outside without any excessive area.

Figure 3B:
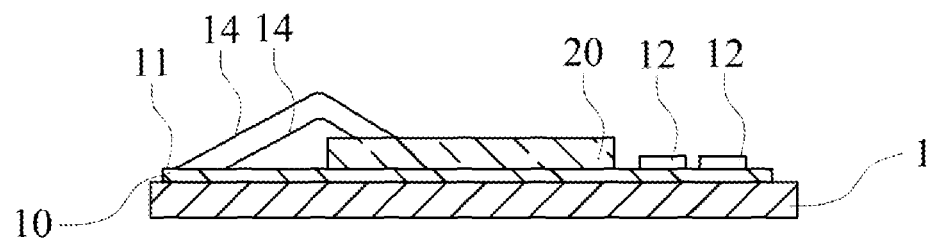
FIG. 3b is a schematic view for connection between a second metal wire and a die in a preferred embodiment.
Figure 3C:
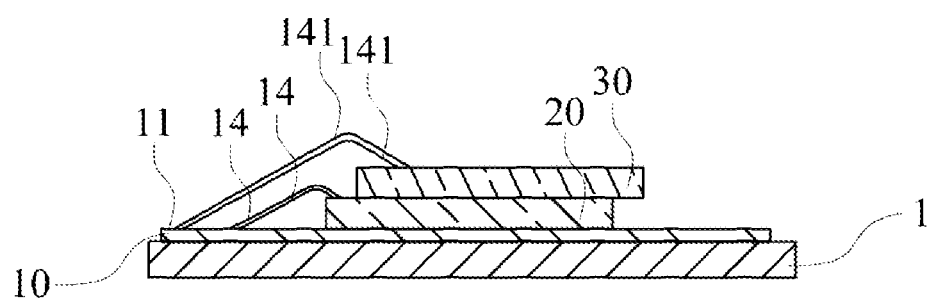
FIG. 3c is a schematic view for connection between a third metal wire and a die in a preferred embodiment.

Referring to FIG. 10a, which illustrates step 1 (51) and step 2 (52) are identical to those of the first embodiment; a second die (30) is stacked on the first die (20) in step 2-1 (521), as shown in FIG. 10a; the second die (30) and the conductive routing layer (10) are electrically connected to each other through a plurality of second metal wires (141) in step 2-2 (522); as shown in FIG. 3c, the second die (30) is adhered on the first die (20) and a plurality of second metal wires (141) are bonded between the top surface (11) of the conductive routing layer (10) and the second die (30) in a wire bonding process for electrical connection between each other; in step 2 (52), step 2-1 (521) and step 2-2 (522), both the first die (20) and the second die (30) are stacked together in advance for a following wire bonding process; alternatively, in step 2 (52), step 2-1 (521) and step 2-2 (522), the first die (20) is adhered for a wire bonding process first and followed by a procedure of stacking the second die (30) on top and proceeding with wire bonding.

Figure 4B:
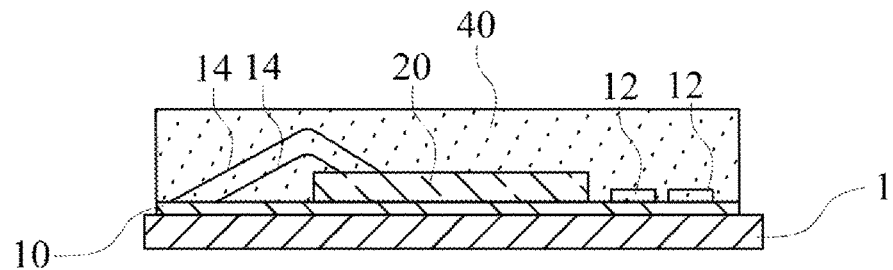
FIG. 4b is a schematic view for a second packaging device in a preferred embodiment.
Figure 4C:
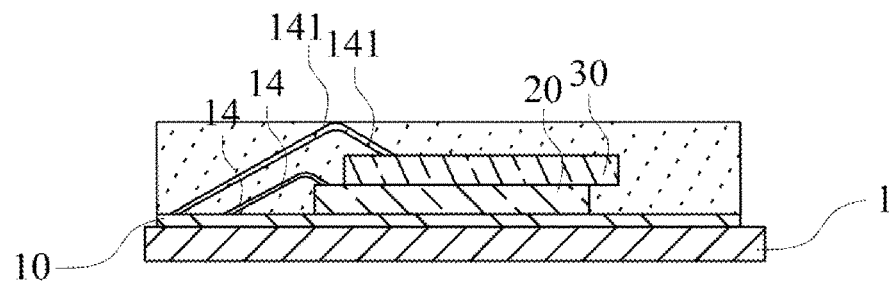
FIG. 4c is a schematic view for a third packaging device in a preferred embodiment.

Referring to FIG. 10a again, which illustrates the second die (20) is encased in a molding compound (40) in step 3 (53) and step 3-2 (532) simultaneously; as shown in FIGS. 3c and 4c, polymer resin in a mold is infused on the conductive routing layer (10) for encapsulating the first metal wires (14), the first die (20), the second metal wire (141) and the second die (30).

Referring to FIG. 10a again, which illustrates step 4 (54) and step 5 (55) are identical to those of the first embodiment.

As shown in FIG. 8d, there isn't a plurality of second metal wires (141) in step 2-2 (522) in the second embodiment and a top surface of the second die (30) is not covered by the molding compound (40); specifically, the second die (30) does not function as an electronic component right now but as auxiliary packaging material of preventing a package from deformation.

Referring to FIGS. 1, 2a, 3e, 4e, 5c, 6e and 10b, which illustrate a rectangular semiconductor package and a method manufacturing the same in the third embodiment; compared with the second die (30) over the first die (20) in the second embodiment, the second die (30) in the third embodiment is mounted beside the first die (20); as shown in FIG. 6e, the second die (30) mounted beside the first die (20) is electrically connected to the conductive routing layer (10) through a plurality of second metal wires (141).

Figure 3D:
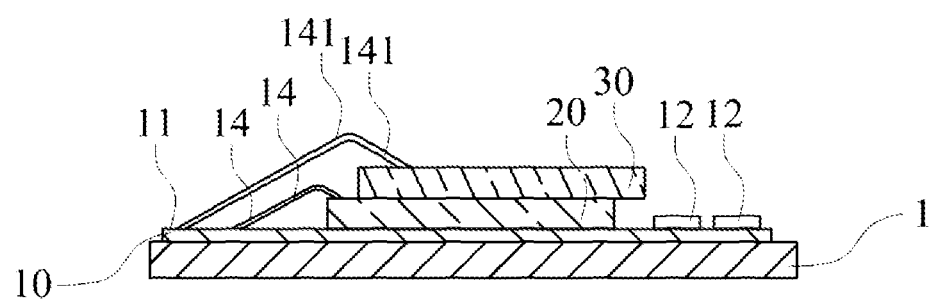
FIG. 3d is a schematic view for connection between a fourth metal wire and a die in a preferred embodiment.
Figure 3E:
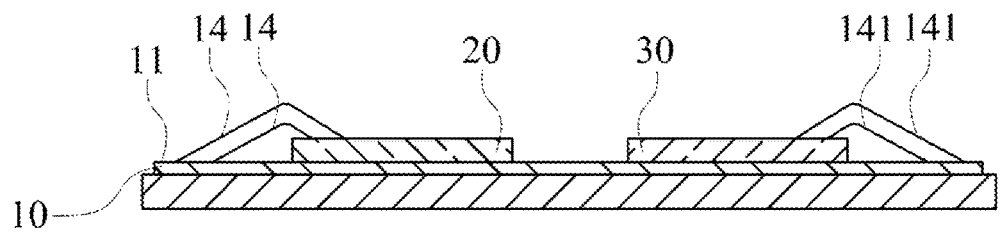
FIG. 3e is a schematic view for connection between a fifth metal wire and a die in a preferred embodiment.

Referring to FIG. 10b, which illustrates step 1 (51) and step 2 (52) are identical to those of the second embodiment; then, a second die (30) is mounted beside the first die (20) as shown in step 2-1a (521a) (FIG. 10b) and the second die (30) is electrically connected to the conductive routing layer (10) through a plurality of second metal wires (141) in step 2-2 (522); as shown in FIG. 3e, with the second die (30) securely adhered beside the first die (20), a plurality of second metal wires (141) are bonded between the top surface (11) of the conductive routing layer (10) and the second die (30) in a wire bonding process for electrical connection of each other; in step 2 (52), step 2-1 (521) and step 2-2 (522), both the first die (20) and the second die (30) are mounted separately for a following wire bonding process; alternatively, in step 2 (52), step 2-1 (521) and step 2-2 (522), the first die (20) is adhered for a wire bonding process first and followed by a procedure of mounting the second die (30) and proceeding with wire bonding.

Figure 4D:
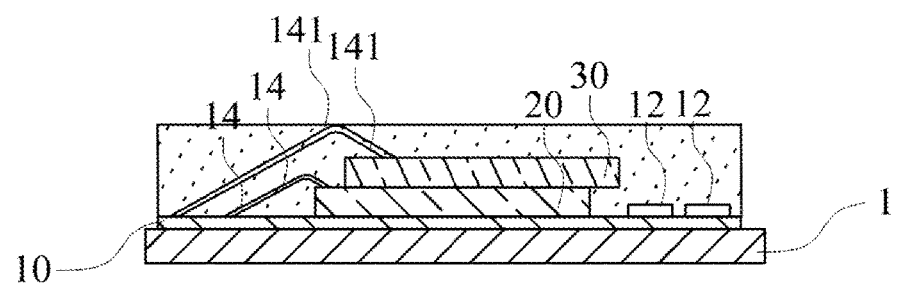
FIG. 4d is a schematic view for a fourth packaging device in a preferred embodiment.
Figure 4E:
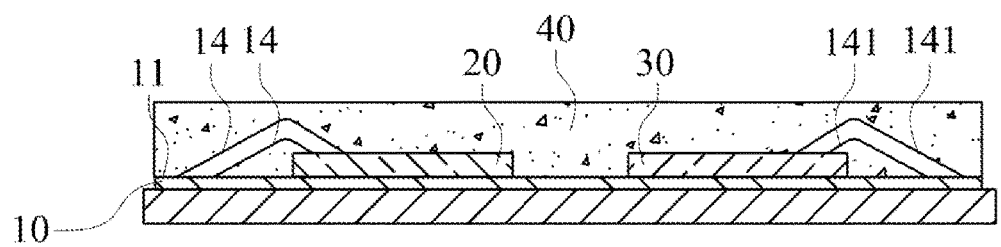
FIG. 4e is a schematic view for a fifth packaging device in a preferred embodiment.

Referring to FIG. 10b, which illustrates the second die (20) is encased in a molding compound (40) in step 3 (53) and step 3-2 (532) simultaneously; as shown in FIGS. 3e and 4e, polymer resin in a mold is infused on the conductive routing layer (10) for encapsulating the first metal wires (14), the first die (20), the second metal wire (141) and the second die (30).

Referring to FIG. 10b again, which illustrates both step 4 (54) and step 5 (55) are identical to those of the second embodiment.

Referring to FIGS. 1, 2b, 3b, 4b, 6b, 7a and 11, which illustrate a rectangular semiconductor package and a method manufacturing the same in the fourth embodiment; compared with components in the first embodiment, conductive bumps (12) and an extra encapsulated component are added in the fourth embodiment; as shown in FIG. 7a, an extra encapsulated component is stacked on the molding compound (40).

Referring to FIG. 11, which illustrates steps from step 1 51) to step 3 (53) are identical to those of the first embodiment; with step 1 (51) executed (FIG. 11), step 1-1 (511) for development of a plurality of conductive bumps (12) on a carrier (1) through the RDL technique is enabled simultaneously, as shown in FIG. 2b; referring to step 2 (52) and step 3 (53), both of which are shown in FIG. 3b and FIG. 4b, respectively.

Referring to FIG. 11, which illustrates a plurality of conductive bumps (12) are processed and exposed on the surface of the molding compound (40) in step 3-1 (531) enabled after step 3 (53), as shown in FIG. 6b; step 3-1 (531) is to expose the conductive bumps (12), which are further processed for electrical connection to the conductive routing layer (10) later.

Referring to FIG. 11 again, which illustrates an encapsulated component is stacked on the molding compound (40) and electrically connected to a plurality of conductive bumps (12) in step 3-3 (533) enabled after step 3-1 (531), as shown in FIG. 7a; step 3-3 (533) is to electrically connect a chip encapsulated for other functions and the outside through the conductive routing layer (10).

In the fourth embodiment as shown in FIG. 8c, the second die (30) is electrically connected to the conductive routing layer (10) through a plurality of conductive bumps (12).

Referring to FIGS. 1, 2b, 3b, 4d, 6d, 7b and 12, which illustrate a rectangular semiconductor package and a method manufacturing the same in the fifth embodiment; the fifth embodiment is an example with the cases in both the second embodiment and the fourth embodiment incorporated.

Referring to FIG. 12, which illustrates a conductive routing layer (10) is created on a carrier (1) in step 1 (51) according to the RDL technique; as shown in FIGS. 1 and 2b, the conductive routing layer (10) in FIG. 2b is created on the simple carrier (1) in FIG. 1 based on the RDL technique.

In step 1-1 (511) executed in FIG. 12, a plurality of conductive bumps (12) are created on the carrier (1) through the RDL technique, as shown in FIG. 2b.

Referring to FIG. 12 again, which illustrates a first die (20) is securely adhered on the conductive routing layer (10) and further electrically connected to the conductive routing layer (10) through a plurality of first metal wires (14) in step 2 (52); as shown in FIGS. 2b and 3b, the first die (20) and the conductive routing layer (10) on which the first die (20) was adhered are electrically connected to each other with a plurality of first metal wires (14) fixed and bonded between the top surface (11) of the conductive routing layer (10) and the first die (20) in a wire bonding process.

In step 2-1 (521) as shown in FIG. 12, a second die (30) is stacked on the first die (20); in step 2-2 (522), the second die (30) and the conductive routing layer (10) are electrically connected to each other through a plurality of second metal wires (141); as shown in FIG. 3d, the second die (30) and the first die (20) on which the second die (30) was adhered are electrically connected to each other with a plurality of first metal wires (14) fixed and bonded between the top surface (11) of the conductive routing layer (10) and the second die (30) in a wire bonding process; in step 2 (52), step 2-1 (521) and step 2-2 (522), both the first die (20) and the second die

(30) are stacked together in advance for a following wire bonding process; alternatively, in step 2 (52), step 2-1 (521) and step 2-2 (522), the first die (20) is adhered for a wire bonding process first and followed by a procedure of stacking the second die (30) on top and proceeding with wire bonding.

Referring to FIG. 12 again, which illustrates the second die (20) is encased in a molding compound (40) in step 3 (53) and step 3-2 (532) simultaneously; as shown in FIGS. 3d and 4d, polymer resin in a mold is infused on the conductive routing layer (10) for encapsulating the first metal wires (14), the first die (20), the second metal wires (141) and the second die (30).

Referring to FIG. 12 again, which illustrates a plurality of conductive bumps (12) are exposed on the surface of the molding compound (40) in step 3-1 (531) enabled after step 3 (53), as shown in FIG. 6b; step 3-1 (531) is to expose the conductive bumps (12), which are further processed for electrical connection to the conductive routing layer (10) later.

Referring to FIG. 12 again, which illustrates an encapsulated component is stacked on the molding compound (40) and electrically connected to a plurality of conductive bumps (12) in step 3-3 (533) enabled after step 3-1 (531), as shown in FIG. 7a; step 3-3 (533) is to electrically connect a chip encapsulated for other functions and the outside through the conductive routing layer (10).

Referring to FIG. 12 again, which illustrates the carrier (1) is removed in step 4 (54); as shown in FIG. 4d, the bottom of the conductive routing layer (10) is exposed after the carrier (1) is removed with a tool.

Referring to FIG. 12 again, which illustrates a plurality of conductive balls (15) and the conductive routing layer (10) are bonded together in step 5 (55); as shown in FIG. 6d, the conductive balls (15) are adhered on the bottom of the conductive routing layer (10) for electrical connection to the first die (20) in a following manufacturing process.

Accordingly, a rectangular semiconductor package and a method of manufacturing the same which differ from conventional semiconductor packages and referred to as creative work in applications of semiconductor packaging meets patentability and is applied for the patent.

It should be reiterated that the above descriptions present the preferred embodiment, and any equivalent change in specifications, claims, or drawings still belongs to the technical field within the present disclosure with reference to claims hereinafter.

What is claimed is:

1. A method of manufacturing a rectangular semiconductor package in which no carrier is required for a die cut from a wafer, presenting steps as follows:
   step 1: a conductive routing layer is created on a carrier by a redistribution layer (RDL) technique;
   step 1.1: simultaneously with step 1, a plurality of conductive bumps is created on the carrier through the RDL technique;
   step 2: a first die is securely adhered on the conductive routing layer and electrically connected to the conductive routing layer through a plurality of first metal wires;
   step 2-1: a second die is stacked on the first die; and
   step 2-2: the second die and the conductive routing layer are electrically connected to each other through a plurality of second metal wires;
   step 3: a molding compound is used to encase the first die;
   step 3-1: a plurality of conductive bumps are processed and exposed on the surface of the molding compound; and
   step 3-2: an encapsulated component is stacked on the molding compound and electrically connected to a plurality of conductive bumps;
   step 4: the carrier is removed;
   step 5: a plurality of conductive balls and the conductive routing layer are bonded together.

2. A method as claimed in claim 1 wherein the second die is mounted beside the first die.

3. A method as claimed in claim 1 wherein the molding compound is used to encase the second die in step 3.

\* \* \* \* \*